(12) United States Patent
Masumoto et al.

(10) Patent No.: US 9,587,326 B2
(45) Date of Patent: Mar. 7, 2017

(54) SILICON CARBIDE EPITAXIAL WAFER, METHOD FOR MANUFACTURING SILICON CARBIDE EPITAXIAL WAFER, DEVICE FOR MANUFACTURING SILICON CARBIDE EPITAXIAL WAFER, AND SILICON CARBIDE SEMICONDUCTOR ELEMENT

(71) Applicant: National Institute of Advanced Industrial Science and Technology, Tokyo (JP)

(72) Inventors: Keiko Masumoto, Tsukuba (JP); Kazutoshi Kojima, Tsukuba (JP); Kentaro Tamura, Kyoto (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 14/778,271

(22) PCT Filed: Feb. 20, 2014

(86) PCT No.: PCT/JP2014/054073
§ 371 (c)(1),
(2) Date: Sep. 18, 2015

(87) PCT Pub. No.: WO2014/156394
PCT Pub. Date: Oct. 2, 2014

(65) Prior Publication Data
US 2016/0168751 A1      Jun. 16, 2016

(30) Foreign Application Priority Data
Mar. 27, 2013 (JP) ................. 2013-066041

(51) Int. Cl.
*H01L 29/15*    (2006.01)
*C30B 25/18*    (2006.01)
(Continued)

(52) U.S. Cl.
CPC ............ *C30B 25/186* (2013.01); *C30B 25/20* (2013.01); *C30B 29/36* (2013.01);
(Continued)

(58) Field of Classification Search
CPC ..................... H01L 29/1608; H01L 29/66068
(Continued)

(56) References Cited

U.S. PATENT DOCUMENTS

| 4,912,063 A | * | 3/1990 | Davis ............... H01L 21/02378 |
| | | | 117/101 |
| 5,011,549 A | * | 4/1991 | Kong ..................... C30B 25/02 |
| | | | 117/101 |

(Continued)

FOREIGN PATENT DOCUMENTS

| JP | 4581081 | 9/2010 |
| JP | 2011-49496 | 3/2011 |
| JP | 2011-121847 | 6/2011 |

OTHER PUBLICATIONS

Tamura, K., Off-angle dependence and starting points of step-bunching on 4H-SiC(0001)Si-face, 2012. The Japan Society of Applied Physics.

*Primary Examiner* — Jami M Valentine
(74) *Attorney, Agent, or Firm* — Carmody Torrance Sandak & Hennessey LLP

(57) ABSTRACT

To provide silicon carbide epitaxial wafer in which occurrence of giant step bunchings (GSBs) caused by basal plane dislocations (BPDs) that occur during hydrogen etching is suppressed on low off-angle silicon carbide substrate to decrease surface defect density of epitaxially grown layer to allow formation of silicon carbide semiconductor device having high reliability, method for manufacturing the wafer, and apparatus for manufacturing the wafer, and silicon carbide semiconductor device having the wafer.

(Continued)

A silicon carbide epitaxial wafer of the present invention is such that epitaxially grown layer is disposed on silicon carbide substrate which has α-type crystal structure and in which (0001) Si face is tilted at greater than 0° and less than 5°, wherein surface defect density of the epitaxially grown layer based on giant step bunching caused by basal plane dislocation on substrate surface of the silicon carbide substrate is ≤20/cm².

16 Claims, 9 Drawing Sheets

(51) Int. Cl.
| | |
|---|---|
| C30B 25/20 | (2006.01) |
| C30B 29/36 | (2006.01) |
| H01L 21/02 | (2006.01) |
| H01L 21/04 | (2006.01) |
| H01L 21/3065 | (2006.01) |
| H01L 29/04 | (2006.01) |
| H01L 29/16 | (2006.01) |

(52) U.S. Cl.
CPC .... *H01L 21/0262* (2013.01); *H01L 21/02378* (2013.01); *H01L 21/02433* (2013.01); *H01L 21/02529* (2013.01); *H01L 21/02658* (2013.01); *H01L 21/0475* (2013.01); *H01L 21/3065* (2013.01); *H01L 29/04* (2013.01); *H01L 29/045* (2013.01); *H01L 29/1608* (2013.01)

(58) Field of Classification Search
USPC .......................................... 257/77; 438/931
See application file for complete search history.

(56) References Cited

U.S. PATENT DOCUMENTS

| | | | | |
|---|---|---|---|---|
| 5,527,417 | A * | 6/1996 | Iida | C23C 16/4405 |
| | | | | 118/723 E |
| 6,097,039 | A * | 8/2000 | Peters | H01L 29/045 |
| | | | | 257/628 |
| 6,214,107 | B1 * | 4/2001 | Kitabatake | C30B 33/00 |
| | | | | 117/95 |
| 2010/0200866 | A1 * | 8/2010 | Kitou | C30B 25/20 |
| | | | | 257/77 |
| 2012/0146056 | A1 * | 6/2012 | Momose | C30B 25/20 |
| | | | | 257/77 |
| 2012/0280254 | A1 * | 11/2012 | Muto | C30B 25/186 |
| | | | | 257/77 |
| 2014/0175461 | A1 * | 6/2014 | Momose | C30B 25/20 |
| | | | | 257/77 |

\* cited by examiner

US 9,587,326 B2

SILICON CARBIDE EPITAXIAL WAFER, METHOD FOR MANUFACTURING SILICON CARBIDE EPITAXIAL WAFER, DEVICE FOR MANUFACTURING SILICON CARBIDE EPITAXIAL WAFER, AND SILICON CARBIDE SEMICONDUCTOR ELEMENT

TECHNICAL FIELD

The present invention relates to a silicon carbide epitaxial wafer having a few surface defects, a method for manufacturing the wafer, and an apparatus for manufacturing the wafer, and a silicon carbide semiconductor device having the wafer.

BACKGROUND ART

In power semiconductor devices, energy loss during power conversion is reduced, and energy saving can be expected. So far, the performance of power semiconductor devices has been improved using silicon (Si) semiconductors, but a situation has been reached in which further performance improvement cannot be anticipated for silicon semiconductor devices because of the Si physical property limit.

On the other hand, silicon carbide (SiC) has excellent physical properties, a dielectric breakdown electric field strength about 10 times that of Si and a forbidden band width and a thermal conductivity about 3 times those of Si, and further performance improvement of power semiconductor devices can be expected, and rapid spread of SiC semiconductors using this is required.

SiC has many crystal types, and for a SiC substrate for a SiC semiconductor device expected as a next-generation semiconductor device for power conversion, one having a 4H type crystal structure is generally used. In addition, from the viewpoint of using a step control epitaxy technique, a 4H—SiC substrate having an off-angle is the mainstream. When an epitaxially grown layer can be effectively formed on a low off-angle SiC substrate having an off-angle of less than 5°, particularly less than 2°, the manufacturing cost of a SiC semiconductor device can be reduced, and with this, wide effective utilization in society is expected.

Usually, when a SiC substrate is cut from a SiC ingot, a predetermined off-angle from the (0001) Si face is formed on the SiC substrate. The cut SiC substrate is surface-processed by polishing or the like and then used in a state of an epitaxial wafer in which an epitaxially grown layer is formed on the substrate surface.

Here, when a rough portion is present on the surface of the epitaxial wafer, the performance of a semiconductor structure fabricated thereon decreases, and the reliability decreases. Particularly, the decrease in the reliability of the oxide film is significant, and the improvement of the surface flatness of the epitaxial wafer is essential for the reliability improvement of a MOSFET or the like.

A SiC substrate cut from a SiC ingot is subjected to hydrogen etching before the formation of an epitaxially grown layer for the purpose of removing surface damage such as polishing flaws to flatten the surface, and the like, and a method for the flatness improvement is also proposed (for example, see PTL 1).

CITATION LIST

Patent Literature

PTL 1: Japanese Patent (JP-B) No. 4581081

Non-Patent Literature

NPL 1: Kentaro Tamura, Masayuki Sasaki, Chiaki Kudo, Hideki Sako, Makoto Kitabatake, Kazutoshi Kojima, "Off-Angle Dependence and Starting Points of Step-Bunching on 4H—SiC(0001)Si-face," 2012, the Japan Society of Applied Physics

SUMMARY OF INVENTION

Technical Problem

However, it has been found that when the off-angle is less than 5°, giant step bunchings (GSBs) caused by basal plane dislocations (BPDs) are likely to occur on the substrate surface of the SiC substrate during hydrogen etching, and the flatness of the substrate deteriorates locally (see NPL 1). It is found that the GSBs caused by BPDs that occur during hydrogen etching have a height of 5 nm or more and a length of 1 mm or less. The presence of these GSBs caused by BPDs causes defects having generally the same shape as the GSBs on the surface of an epitaxially grown layer subsequently formed, causing a decrease in the reliability of a semiconductor device, particularly an oxide film. In addition, the GSBs caused by BPDs tend to become longer as the off-angle becomes smaller, increasing the obstacle when a low off-angle SiC substrate is used.

When the occurrence of such GSBs caused by BPDs, which locally deteriorate the flatness of a low off-angle SiC substrate, can be suppressed, a SiC epitaxial wafer having better flatness can be provided, and a SiC semiconductor device having high reliability can be provided in turn.

An object of the present invention is to solve the various problems in related art and achieve the following object. In other words, it is an object of the present invention to provide a silicon carbide epitaxial wafer in which the occurrence of giant step bunchings (GSBs) caused by basal plane dislocations (BPDs) that occur during hydrogen etching is suppressed on a low off-angle silicon carbide substrate to decrease the surface defect density of an epitaxially grown layer to allow the formation of a silicon carbide semiconductor device having high reliability, a method for manufacturing the wafer, and an apparatus for manufacturing the wafer, and a silicon carbide semiconductor device having the wafer.

The present inventors have studied diligently in order to solve the problem, and as a result obtained the finding that the occurrence of GSBs caused by BPDs that occur during hydrogen etching can be suppressed by setting the etching depth of hydrogen etching on a SiC substrate at a certain value or less.

Solution to Problem

The present invention is based on the finding, and the means for solving the problem is as follows.

<1> A silicon carbide epitaxial wafer in which an epitaxially grown layer is disposed on a silicon carbide substrate which has an α-type crystal structure and in which a (0001) Si face is tilted at greater than 0° and less than 5°, wherein a surface defect density of the epitaxially grown layer based on giant step bunching caused by basal plane dislocation on a substrate surface of the silicon carbide substrate is 20/cm² or less.

<2> A method for manufacturing a silicon carbide epitaxial wafer, including introducing an etching gas containing hydrogen gas onto a substrate surface of a silicon carbide substrate which has an α-type crystal structure and in which a (0001) Si face is tilted at greater than 0° and less than 5° to perform hydrogen etching; and introducing a raw material gas to form an epitaxially grown layer on the substrate surface after the hydrogen etching, wherein the hydrogen etching is carried out under etching conditions for setting etching depth with respect to the substrate surface at 1 nm or less.

<3> The method for manufacturing a silicon carbide epitaxial wafer according to <2>, wherein the etching depth in the hydrogen etching is adjusted by controlling a hydrogen flow rate.

<4> The method for manufacturing a silicon carbide epitaxial wafer according to <2> or <3>, wherein the hydrogen etching and formation of the epitaxially grown layer are continuously carried out by one of starting introduction of the raw material gas in the formation of the epitaxially grown layer generally simultaneously with stop of introduction of the etching gas in the hydrogen etching, and additionally introducing as the raw material gas a gas necessary for the formation of the epitaxially grown layer lacking in the etching gas in a state in which introduction of the etching gas is continued.

<5> The method for manufacturing a silicon carbide epitaxial wafer according to any one of <2> to <4>, wherein silane gas is contained in the etching gas and the raw material gas.

<6> The method for manufacturing a silicon carbide epitaxial wafer according to any one of <2> to <5>, wherein a silicon carbide substrate in which a (0001) Si face is tilted in a <11-20> direction at greater than 0° and less than 5° is used.

<7> An apparatus for manufacturing a silicon carbide epitaxial wafer that manufactures the silicon carbide epitaxial wafer according to <1>, including a reaction furnace having a gas discharge port allowing adjustment of pressure in the furnace via a discharge valve, a heating portion allowing increase of temperature in the furnace, an etching gas introduction port allowing introduction of an etching gas into the furnace via one introduction valve, a raw material gas introduction port allowing introduction of a raw material gas into the furnace via another introduction valve, and a placement portion configured to place the silicon carbide substrate in the furnace; an etching gas introduction pipe connected to the etching gas introduction port; and a raw material gas introduction pipe connected to the raw material gas introduction port.

<8> A silicon carbide semiconductor device including: the silicon carbide epitaxial wafer according to <1>.

Advantageous Effects of Invention

According to the present invention, the various problems in related art can be solved, and it is possible to provide a silicon carbide epitaxial wafer in which the occurrence of giant step bunchings (GSBs) caused by basal plane dislocations (BPDs) that occur during hydrogen etching is suppressed on a low off-angle silicon carbide substrate to decrease the surface defect density of an epitaxially grown layer to allow the formation of a silicon carbide semiconductor device having high reliability, a method for manufacturing the wafer, and an apparatus for manufacturing the wafer, and a silicon carbide semiconductor device having the wafer.

DESCRIPTION OF EMBODIMENTS

Silicon Carbide Epitaxial Wafer

The silicon carbide epitaxial wafer of the present invention is a silicon carbide epitaxial wafer in which an epitaxially grown layer is disposed on a silicon carbide substrate which has an α-type crystal structure and in which the (0001) Si face is tilted at greater than 0° and less than 5°, wherein the surface defect density of the epitaxially grown layer based on giant step bunching (hereinafter abbreviated as "GSB") caused by basal plane dislocation (hereinafter abbreviated as "BPD") on the substrate surface of the silicon carbide substrate is 20/cm² or less.

Figure 1:
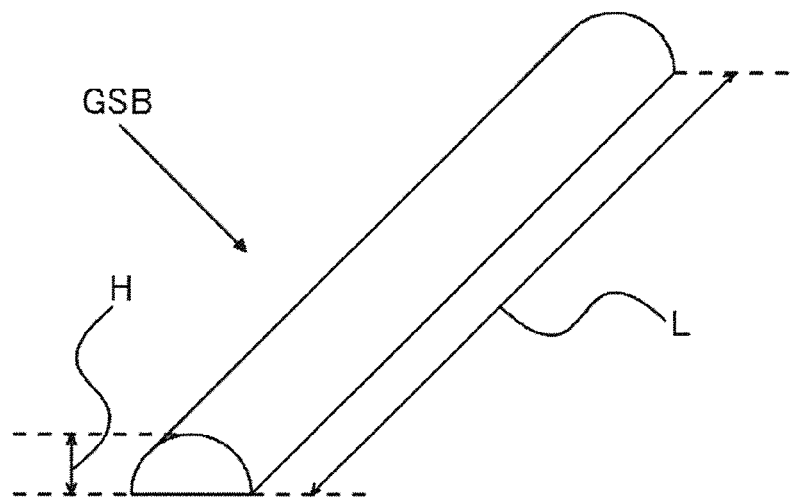
FIG. 1 is an explanatory diagram for explaining a GSB caused by a BPD.

The shape of the GSB is shown in FIG. 1. FIG. 1 is an explanatory diagram for explaining the GSB caused by the BPD.

As shown in FIG. 1, the GSB is a protruding surface defect having a height H of 5 nm or more and a length L of 1 mm or less formed in a protruding manner on the substrate surface. In the manufacture of the silicon carbide epitaxial wafer, other step bunchings caused by treatment other than the hydrogen etching may occur, but the GSBs do not include such step bunchings. The other step bunchings have a shape having a height H of less than 5 nm or a shape having a length L of more than 1 mm.

The presence of the GSBs provides protruding surface defects having generally the same shape to the epitaxially grown layer formed on the GSBs.

The method for measuring from the silicon carbide epitaxial wafer the surface defect density of the epitaxially grown layer based on the GSBs on the silicon carbide substrate can be performed by measuring the surface morphology of the surface of the epitaxially grown layer by an AFM (Atomic Force Microscope) and confirming protruding surface defects having a height of 5 nm or more and a length of 1 mm or less because the GSBs have a protruding shape having a height of 5 nm or more and a length of 1 mm or less.

In addition, the measurement of whether the GSBs are caused by the BPDs or not can be performed by confirming the crystal structure by an X-ray topograph.

By using a silicon carbide epitaxial wafer having a few such surface defects, the reliability of a silicon carbide semiconductor device can be improved. In addition, this silicon carbide epitaxial wafer can be manufactured by a method for manufacturing a silicon carbide epitaxial wafer according to the present invention described below.

(Method for Manufacturing Silicon Carbide Epitaxial Wafer)

The method for manufacturing a silicon carbide epitaxial wafer according to the present invention includes a hydrogen etching step and an epitaxially grown layer forming step and includes other steps as needed.

<Hydrogen Etching Step>

The hydrogen etching step is the step of introducing an etching gas containing hydrogen gas onto the substrate surface of a silicon carbide substrate which has an α-type crystal structure and in which the (0001) Si face is tilted at greater than 0° and less than 5° to perform hydrogen etching, and the core of the technique is that the hydrogen etching step is carried out under etching conditions for setting the etching depth with respect to the substrate surface at 1 nm or less.

The silicon carbide substrate having an α-type crystal structure is not particularly limited, and either a 4H type or a 6H type silicon carbide substrate can be used.

In addition, the silicon carbide substrate is not particularly limited, but a silicon carbide substrate in which the (0001) Si face is tilted in the <11-20> direction at greater than 0° and less than 5° is preferred. In other words, such a silicon carbide substrate is the most generally developed and commercially available substrate and is easily available and therefore has the advantage of being easily used for the manufacture of the silicon carbide epitaxial wafer.

Further, the tilt, that is, the off-angle, is not particularly limited as long as it is greater than 0° and less than 5°, but it is preferably less than 2°. By using a silicon carbide substrate having such an off-angle, the manufacturing cost of a silicon carbide semiconductor device can be reduced.

The silicon carbide substrate may be formed according to a known method or may be obtained from a commercial product and used.

The etching gas is not particularly limited as long as it contains the hydrogen gas. But, the etching gas preferably contains silane gas ($SiH_4$) used as a raw material gas used in the epitaxially grown layer forming step.

When the etching gas contains the silane gas, the roughness of the surface of the silicon carbide substrate due to the other step bunchings can be suppressed, and the amount of etching of the hydrogen etching can be decreased.

The flow rate of the etching gas in the hydrogen etching step is not particularly limited and can be appropriately selected according to the purpose, and the flow rate of the hydrogen gas is preferably greater than 0 slm and 300 slm or less. When the flow rate of the hydrogen gas is more than 300 slm, it is necessary to set the pressure at atmospheric pressure or higher in order to set the etching depth at 1 nm or less, and it may be difficult to ensure the safety of the manufacturing apparatus. The unit, 1 slm, corresponds to 1.69 Pa·m$^3$/s.

In addition, the flow rate of the silane gas is preferably greater than 0 sccm and 5 sccm or less. When the flow rate of the silane gas is more than 5 sccm, a large amount of pits may occur on the silicon carbide substrate. The unit, 1 sccm, corresponds to $1.69 \times 10^{-3}$ Pa·m$^3$/s.

When the silane gas is used, the hydrogen gas and the silane gas may be introduced in a mixed state but may be sequentially introduced. For example, it is also possible to start the introduction of the hydrogen gas first and start the introduction of the silane gas later.

The temperature condition in the hydrogen etching step is not particularly limited, can be appropriately selected according to the purpose, and is preferably 1,400° C. to 1,750° C. When the temperature condition is less than 1,400° C., instantaneous transition to the epitaxially grown layer forming step may be difficult. When the temperature condition is more than 1,750° C., it may be difficult to ensure the heat resistance of the silicon carbide epitaxial wafer manufacturing apparatus.

The pressure condition in the hydrogen etching step is not particularly limited, can be appropriately selected according to the purpose, and is preferably 1 kPa to 100 kPa. When the pressure condition is less than 1 kPa, it is necessary to set at less than 1,400° C. the temperature condition for setting the etching depth at 1 nm or less, and therefore transition to the epitaxially grown layer forming step may be difficult. When the pressure condition is more than 100 kPa, it may be difficult to ensure the safety of the silicon carbide epitaxial wafer manufacturing apparatus.

As described above, for the etching conditions of the hydrogen etching, it is required to set the etching depth at 1 nm or less. When the etching depth is more than 1 nm, the GSBs caused by the BPDs occur at more than 20/cm$^2$, significantly decreasing the reliability of the silicon carbide semiconductor device using the silicon carbide substrate.

In order to perform the hydrogen etching so as to satisfy the etching conditions, it is necessary to appropriately adjust various conditions of the flow rate of the etching gas, pressure, and temperature. Among them, from the viewpoint of safety and convenience, the flow rate of the etching gas is preferably controlled to satisfy the etching conditions. On the other hand, when the pressure and the temperature are controlled, it is difficult to instantaneously adjust them at the pressure and temperature conditions of formation of the epitaxially grown layer in the epitaxially grown layer forming step in transition to the epitaxially grown layer forming step after the hydrogen etching step. Therefore, it is preferred that the pressure and temperature of the hydrogen etching step are adjusted according to the pressure and temperature in the epitaxially grown layer forming step, and the flow rates of the gases used are controlled during the transition between the hydrogen etching step and the epitaxially grown layer forming step.

<Epitaxially Grown Layer Forming Step>

The epitaxially grown layer forming step is the step of introducing a raw material gas to form an epitaxially grown layer on the substrate surface after the hydrogen etching.

Examples of the raw material gas include a mixed gas of hydrogen gas as a carrier gas, silane gas as a Si source, and propane gas as a C source ($C_3H_8$). However, the raw material gas is not limited to these and may be selected from other gases.

When the hydrogen gas, the silane gas, and the propane gas are used as the raw material gas, the flow rate of the hydrogen gas is preferably 50 slm to 300 slm. When the flow rate of the hydrogen gas is less than 50 slm, the quality of the epitaxially grown layer may worsen significantly. When the flow rate of the hydrogen gas is more than 300 slm, it may be difficult to ensure the safety of the silicon carbide epitaxial wafer manufacturing apparatus.

In addition, the flow rate of the silane gas is preferably 2 sccm to 100 sccm. When the flow rate is less than 2 sccm, the growth rate is slow, and therefore efficient manufacture may be difficult. When the flow rate is more than 100 sccm, the quality of the epitaxially grown layer due to the deposition of silicon may decrease.

In addition, the flow rate of the propane gas is preferably 2 sccm to 100 sccm. When the flow rate is less than 2 sccm, the growth rate is slow, and therefore efficient manufacture may be difficult. When the flow rate is more than 100 sccm, the formation of the epitaxially grown layer in step control epitaxy may be difficult.

The transition from the hydrogen etching step to the epitaxially grown layer forming step is preferably instantaneously performed. When the transition from the hydrogen etching step to the epitaxially grown layer forming step is slowly performed, defects caused by the epitaxially grown layer forming step, such as stacking faults and triangular defects, may occur in the epitaxially grown layer formed before reaching the optimum conditions of the formation of the epitaxially grown layer.

Therefore, it is preferred that the hydrogen etching step and the epitaxially grown layer forming step are continuously carried out by starting the introduction of the raw material gas in the epitaxially grown layer forming step generally simultaneously with the stop of the introduction of the etching gas in the hydrogen etching step, or additionally introducing as the raw material gas a gas necessary for the formation of the epitaxially grown layer lacking in the etching gas in a state in which the introduction of the etching gas is continued, and the transition between these steps is instantaneously performed. In the latter implementation method, for example, when the hydrogen gas and the silane gas are used as the etching gas, and the hydrogen gas, the silane gas, and the propane gas are used as the raw material gas, it is recommended that the propane gas that is a gas component lacking in the etching gas is additionally introduced, and when the flow rates of the hydrogen and the silane gas introduced as the etching gas are insufficient in amount as the raw material gas, these insufficient amounts of the hydrogen and the silane gas are additionally introduced. In addition, the transition can be instantaneously performed by separating a gas introduction path into two types, an introduction path for the etching gas and an introduction path for the raw material gas.

The temperature condition in the epitaxially grown layer forming step is not particularly limited, can be appropriately selected according to the purpose, is, for example, about 1,400° C. to 1,750° C., and is preferably the same as the temperature condition in the hydrogen etching step from the viewpoint of instantaneously performing the transition from the hydrogen etching step to the epitaxially grown layer forming step.

The pressure condition in the epitaxially grown layer forming step is not particularly limited, can be appropriately selected according to the purpose, is, for example, about 1 kPa to 100 kPa, and is preferably the same as the pressure condition in the hydrogen etching step from the viewpoint of instantaneously performing the transition from the hydrogen etching step to the epitaxially grown layer forming step.

<Other Steps>

The other steps are not particularly limited as long as the effect of the present invention is not impaired. The other steps can be appropriately selected according to the purpose from various manufacturing steps carried out in the manufacture of known silicon carbide epitaxial wafers.

The method for manufacturing a silicon carbide epitaxial wafer described above can be preferably carried out by an apparatus for manufacturing a silicon carbide epitaxial wafer according to the present invention described below.

(Apparatus for Manufacturing Silicon Carbide Epitaxial Wafer)

The apparatus for manufacturing a silicon carbide epitaxial wafer according to the present invention has at least a reaction furnace having a gas discharge port allowing the adjustment of the pressure in the furnace via a discharge valve, a heating portion allowing the increase of the temperature in the furnace, an etching gas introduction port allowing the introduction of an etching gas into the furnace via one introduction valve, a raw material gas introduction port allowing the introduction of a raw material gas into the furnace via another introduction valve, and a placement portion configured to place the silicon carbide substrate in the furnace; an etching gas introduction pipe connected to the etching gas introduction port; and a raw material gas introduction pipe connected to the raw material gas introduction port, and has other constitutions as needed.

In the apparatus for manufacturing a silicon carbide epitaxial wafer, two types of gas introduction pipes, the etching gas introduction pipe and the raw material gas introduction pipe, are disposed from the viewpoint of instantaneously performing transition from the hydrogen etching step to the epitaxially grown layer forming step. In other words, in transition from the hydrogen etching step to the epitaxially grown layer forming step, the opening and closing of the valves in the etching gas introduction port and the raw material gas introduction port can be instantaneously switched so that the introduction of the raw material gas into the reaction furnace from the raw material gas introduction pipe is started generally simultaneously with the stop of the introduction of the etching gas into the reaction furnace from the etching gas introduction pipe, or a gas necessary for the formation of the epitaxially grown layer lacking in the etching gas is additionally introduced from the raw material gas introduction pipe as the raw material gas in a state in which the introduction of the etching gas from the etching gas introduction pipe is continued.

It is preferred that the etching gas introduction pipe and the raw material gas introduction pipe have a structure in which the tip side is connected to the reaction furnace, and on the base end side, the introduction path is branched according to the introduced gas species, and a mass flow controller (MFC) for controlling the flow rate of each of the introduced gases is disposed at each branch position.

Each portion of the apparatus for manufacturing a silicon carbide epitaxial wafer can be formed according to the structure of a known chemical vapor deposition apparatus.

In addition, the other constitutions are not particularly limited, and constitutions used in a known chemical vapor deposition apparatus can be appropriately selected according to the purpose.

(Silicon Carbide Semiconductor Device)

The silicon carbide semiconductor device has at least the silicon carbide epitaxial wafer of the present invention and has other constitutions according to the device structure of the target semiconductor device.

The semiconductor device is not particularly limited as long as it has the silicon carbide epitaxial wafer. The semiconductor device can be appropriately selected according to the purpose. Examples of the semiconductor device include Schottky barrier diodes (SBDs), MOSFETs (Metal-Oxide-Semiconductor Field-Effect Transistors), JFETs (Junction Field-Effect Transistors), pn diodes, pin diodes, IGBTs (Insulated-Gate Bipolar Transistors), and trench MOSFETs.

The other constitutions are not particularly limited and can be appropriately selected from known structures according to the device structure of the semiconductor device.

EXAMPLES

Example 1

A typical silicon carbide substrate having a 4H crystal structure was provided as a silicon carbide substrate having an α-type crystal structure. This silicon carbide substrate has a substrate surface in which the (0001) Si face is tilted in the <11-20> direction at 0.9°.

Figure 2:
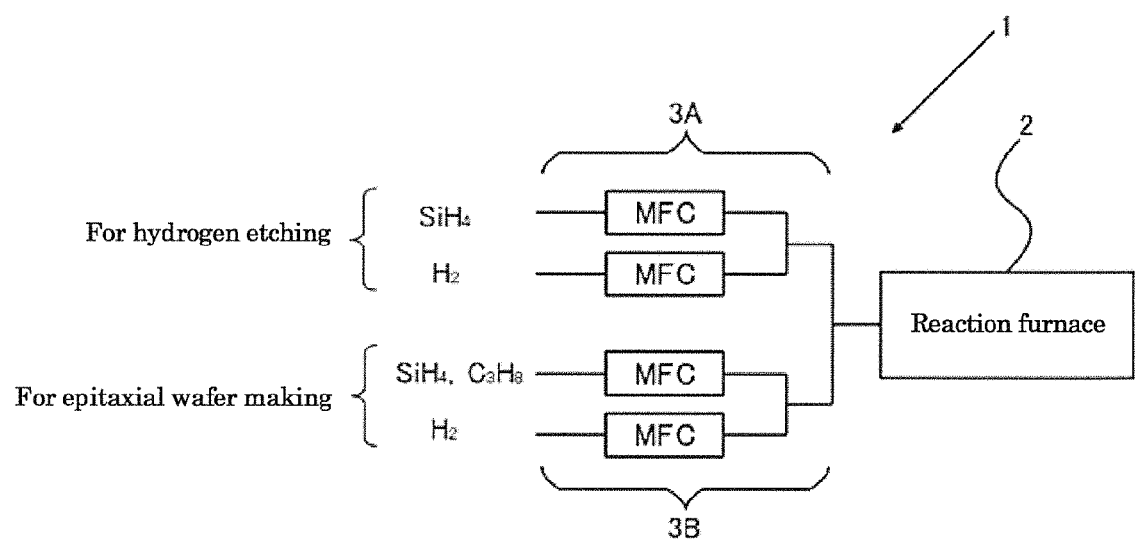
FIG. 2 is an explanatory diagram showing the schematic configuration of a silicon carbide epitaxial wafer manufacturing apparatus 1.

This silicon carbide substrate was placed in a reaction furnace 2 in a silicon carbide epitaxial wafer manufacturing apparatus 1 shown in FIG. 2, and a silicon carbide epitaxial wafer according to Example 1 was manufactured as follows. FIG. 2 is an explanatory diagram showing the schematic configuration of the silicon carbide epitaxial wafer manufacturing apparatus 1.

Here, the silicon carbide epitaxial manufacturing apparatus 1 has as a chemical vapor deposition apparatus a reaction furnace 2 having a gas discharge port allowing the adjustment of the pressure in the furnace via a discharge valve, a heating portion allowing the increase of the temperature in the furnace, an etching gas introduction port allowing the introduction of an etching gas into the furnace via one introduction valve, a raw material gas introduction port allowing the introduction of a raw material gas into the furnace via another introduction valve, and a placement portion configured to place the silicon carbide substrate in the furnace; an etching gas introduction pipe 3A connected to the etching gas introduction port; and a raw material gas introduction pipe 3B connected to the raw material gas introduction port. Each of the etching gas introduction pipe 3A and the raw material gas introduction pipe 3B has a structure in which the tip side is connected to the reaction furnace 2, and the base end side is branched into two according to the introduced gases, and a mass flow controller (MFC) for controlling the flow rate of the gas is disposed at each branch position.

<Hydrogen Etching Step>

In a state in which hydrogen gas was introduced into the reaction furnace 2 from the etching gas introduction pipe 3A at a flow rate of 30 slm, the pressure in the reaction furnace 2 was maintained at 10 kPa, and the silicon carbide substrate was heated to 1,500° C. by heating by the heating portion (a high frequency induction heating portion here). Then, in a state in which silane, which was also a raw material gas for the formation of the epitaxially grown layer, was introduced at a flow rate of 3.5 sccm, the silicon carbide substrate was heated to 1,660° C., and hydrogen etching in this state was performed for 1 minute.

<Epitaxially Grown Layer Forming Step>

Then, hydrogen, silane, and propane were introduced into the reaction furnace 2 from the raw material gas introduction pipe 3B at flow rates of 100 slm, 50 sccm, and 12 sccm, respectively, simultaneously with the stop of the introduction of the gases into the reaction furnace 2 from the etching gas introduction pipe 3A to form an epitaxially grown layer with a thickness of 10 μm on the substrate surface of the silicon carbide substrate.

By the above, the silicon carbide epitaxial wafer according to Example 1 was manufactured.

Comparative Example 1

In addition, a silicon carbide epitaxial wafer according to Comparative Example 1 was similarly manufactured except that in the hydrogen etching step in Example 1, the hydrogen flow rate was changed from 30 slm to 100 slm.

<Measurement>

A hydrogen etching step was carried out under the same conditions as the hydrogen etching step in Example 1 to fabricate an observation substrate.

In addition, a hydrogen etching step was carried out under the same conditions as the hydrogen etching step in Comparative Example 1 to fabricate an observation substrate for comparison.

—Measurement of GBS Density—

For the observation substrate fabricated based on the conditions of the hydrogen etching step in Example 1, and the observation substrate for comparison fabricated based on the conditions of the hydrogen etching step in Comparative Example 1, the substrate surfaces of these were photographed by a confocal microscope, and the GSB density was observed.

Figure 3:
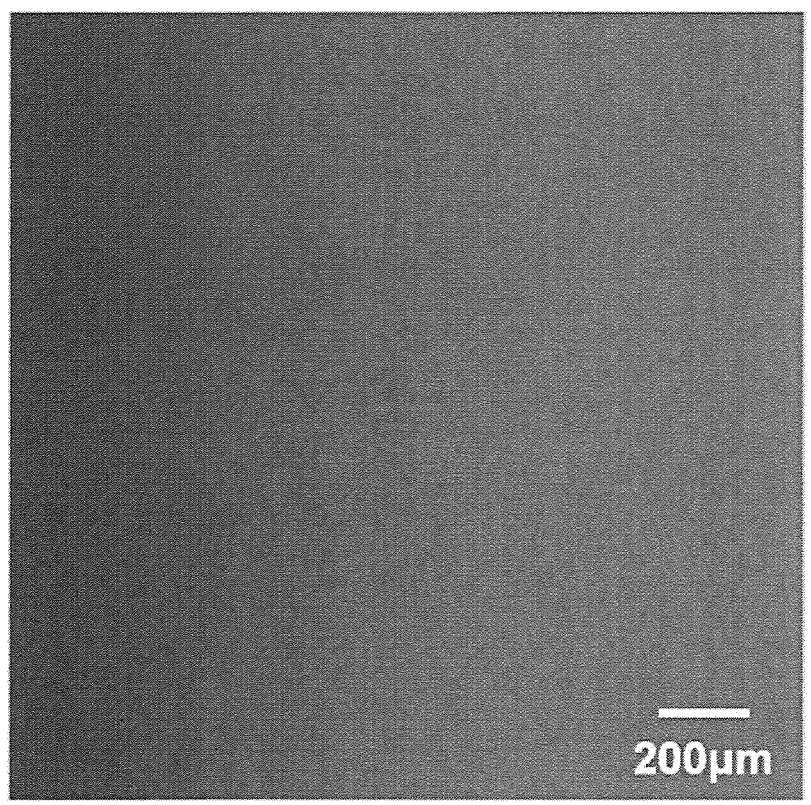
FIG. 3 is a diagram showing a confocal microscope image obtained by photographing the substrate surface of an observation substrate fabricated based on the conditions of a hydrogen etching step in Example 1.
Figure 4:
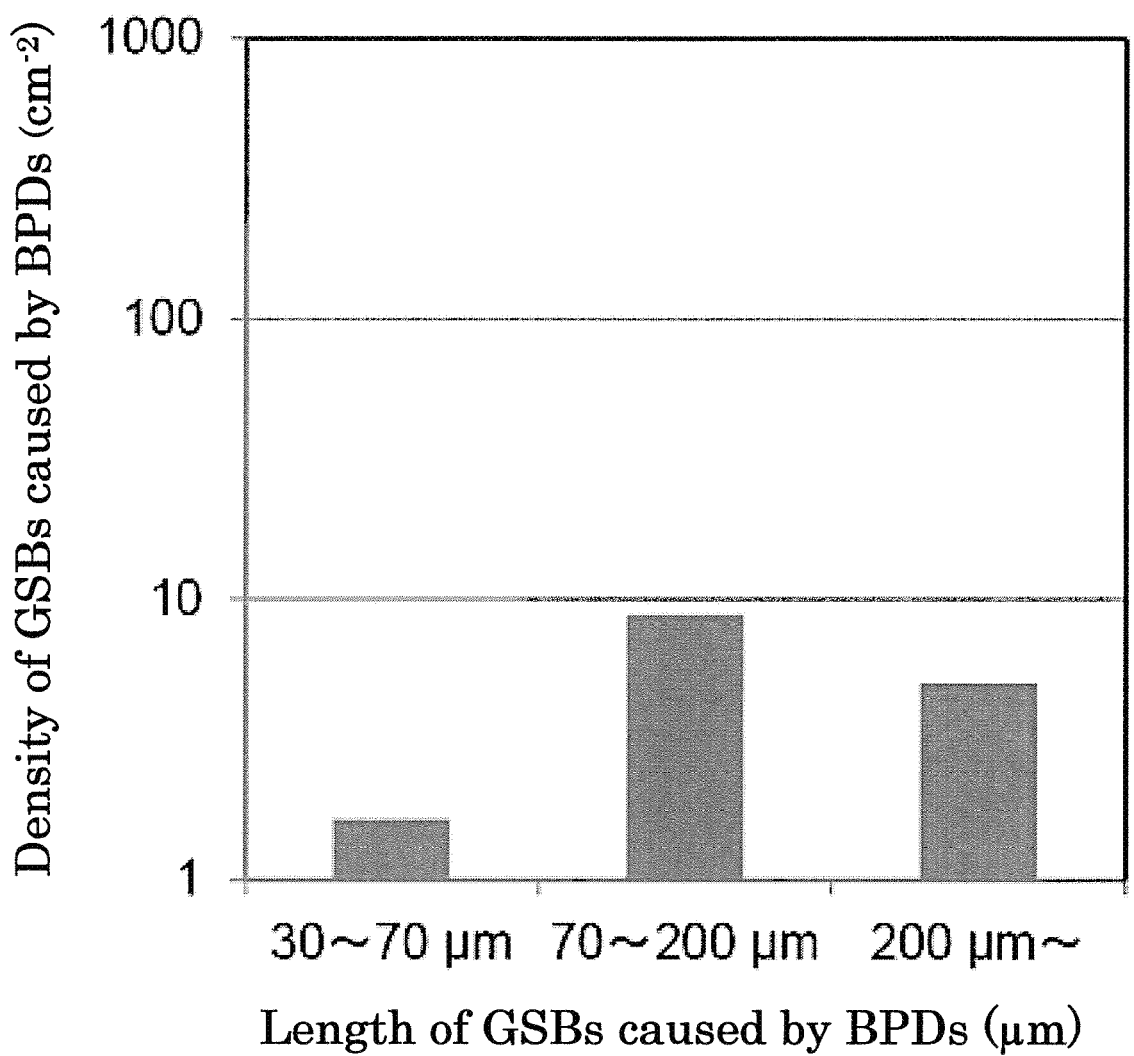
FIG. 4 is a diagram showing the length distribution of GSBs observed from the confocal microscope image obtained by photographing the substrate surface of the observation substrate fabricated based on the conditions of the hydrogen etching step in Example 1.

FIG. 3 shows a confocal microscope image obtained by photographing the substrate surface of the observation substrate fabricated based on the conditions of the hydrogen etching step in Example 1, and FIG. 4 shows the length distribution of GSBs observed from the confocal microscope image obtained by photographing the substrate surface of the observation substrate fabricated based on the conditions of the hydrogen etching step in Example 1.

Figure 5:
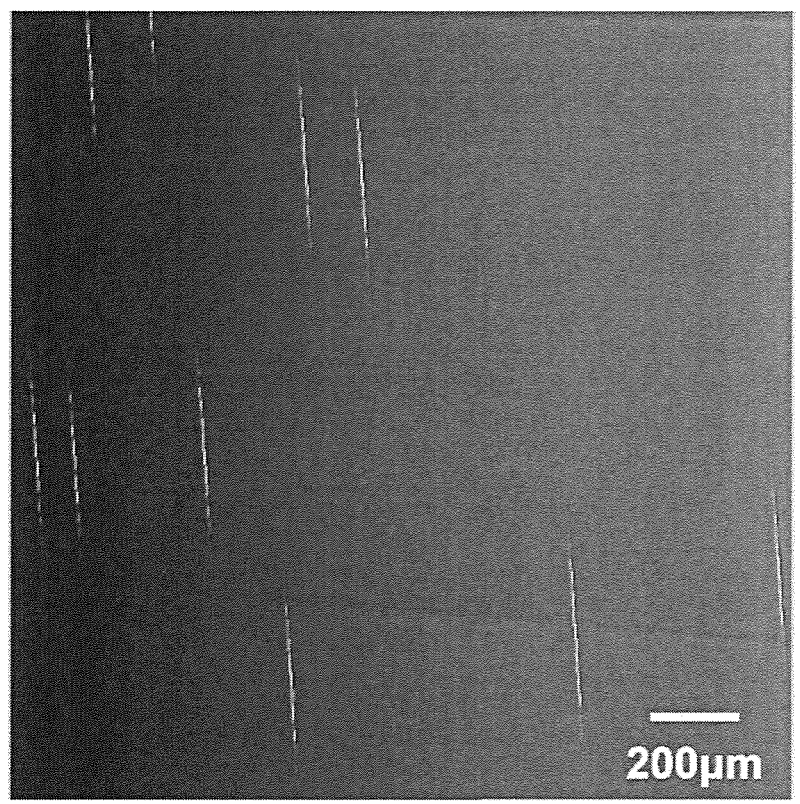
FIG. 5 is a diagram showing a confocal microscope image obtained by photographing the substrate surface of an observation substrate for comparison fabricated based on the conditions of a hydrogen etching step in Comparative Example 1.
Figure 6:
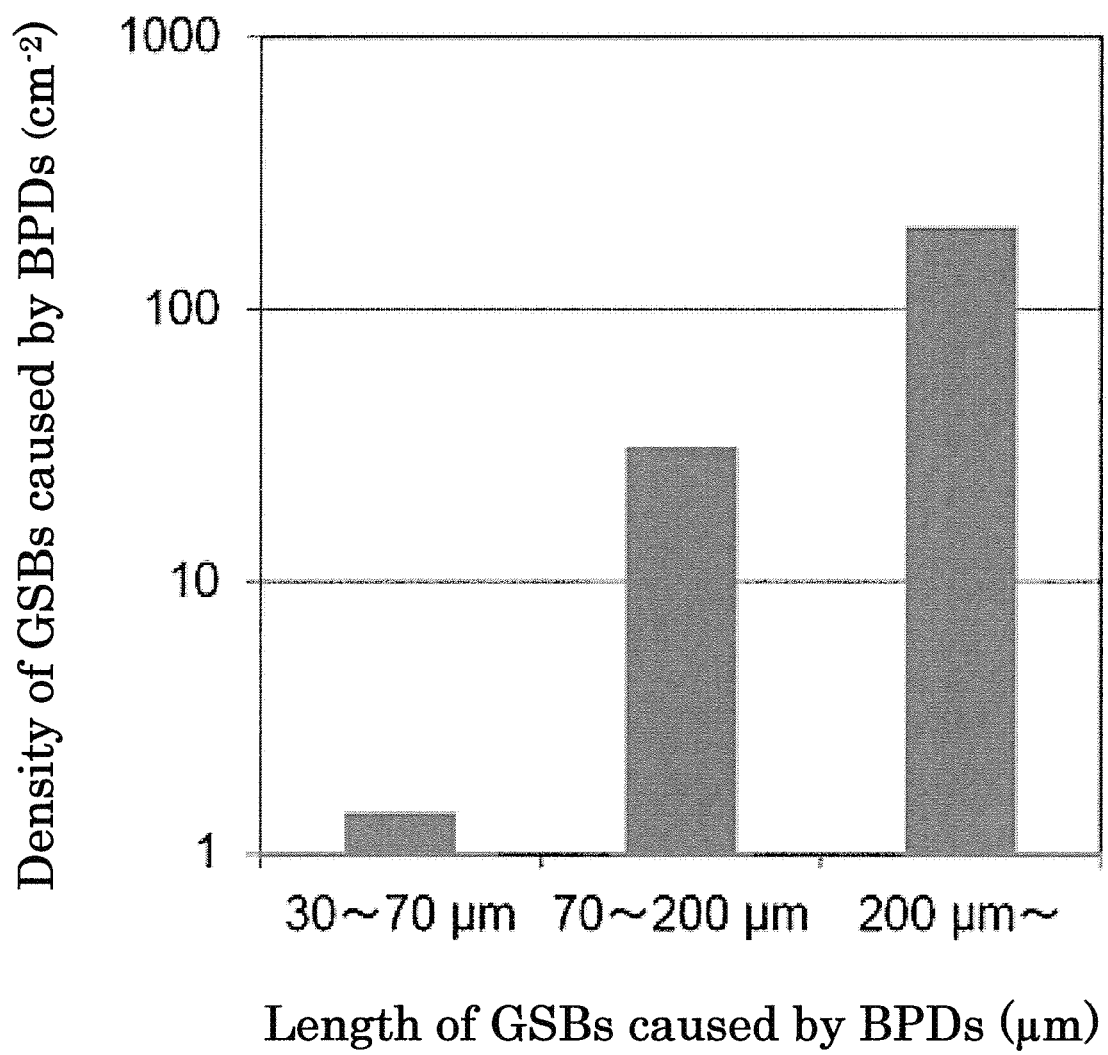
FIG. 6 is a diagram showing the length distribution of GSBs observed from the confocal microscope image obtained by photographing the substrate surface of the observation substrate for comparison fabricated based on the conditions of the hydrogen etching step in Comparative Example 1.

In addition, FIG. 5 shows a confocal microscope image obtained by photographing the substrate surface of the observation substrate for comparison fabricated based on the conditions of the hydrogen etching step in Comparative Example 1, and FIG. 6 shows the length distribution of GSBs observed from the confocal microscope image obtained by photographing the substrate surface of the observation substrate for comparison fabricated based on the conditions of the hydrogen etching step in Comparative Example 1.

As shown in FIG. 3 and FIG. 5, in the observation substrate fabricated based on the conditions of the hydrogen etching step in Example 1, few GSBs are confirmed, whereas in the observation substrate for comparison fabricated based on the conditions of the hydrogen etching step in Comparative Example 1, a large number of GSBs are confirmed.

In addition, as shown in FIG. 4 and FIG. 6, the length of the GSBs present on the observation substrate fabricated based on the conditions of the hydrogen etching step in Example 1 is shorter than the length of the GSBs present on the observation substrate for comparison fabricated based on the conditions of the hydrogen etching step in Comparative Example 1.

In addition, as a result of observing the GSB density, the GSB density of the observation substrate fabricated based on the conditions of the hydrogen etching step in Example 1 was 16/cm², and the GSB density of the observation substrate for comparison fabricated based on the conditions of the hydrogen etching step in Comparative Example 1 was about 200/cm².

Figure 7:
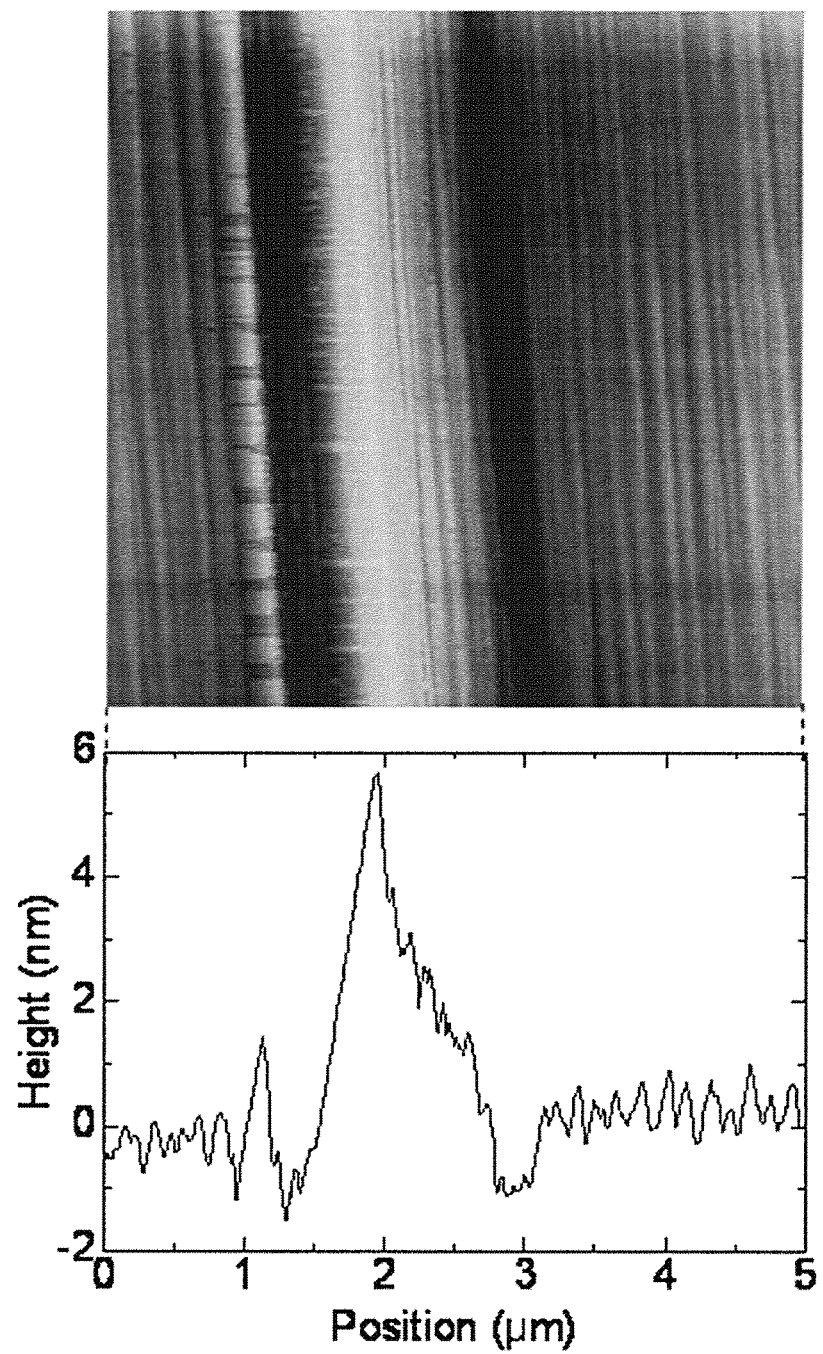
FIG. 7 is a diagram showing an AFM image obtained by photographing GSBs on the substrate surface of the observation substrate fabricated based on the conditions of the hydrogen etching step in Example 1, and its cross-sectional profile.

In addition, FIG. 7 shows an AFM image obtained by photographing the GSBs on the substrate surface of the observation substrate fabricated based on the conditions of the hydrogen etching step for the silicon carbide epitaxial wafer according to Example 1, and its cross-sectional profile. The upper side in FIG. 7 shows the AFM image, and the lower side shows a partial cross-sectional profile of the substrate surface at the position corresponding to the AFM image. In FIG. 7, the protruding shape of the GSBs can be confirmed.

—Measurement of Etching Depth—

It is difficult to directly measure the accurate etching depth of the silicon carbide substrate because the etching depth is extremely shallow. Here, utilizing the fact that the etching rate for the epitaxially grown layer having the same crystal structure as the silicon carbide substrate was the same as the etching rate for the silicon carbide substrate, the etching depth was measured as follows.

In other words, first, the thickness of the silicon carbide epitaxial wafer according to Example 1 was measured using a Fourier transform infrared spectrophotometer (FT-IR).

Then, the epitaxially grown layer of the silicon carbide epitaxial wafer according to Example 1 was subjected to hydrogen etching under the same conditions as the hydrogen etching in Example 1 except etching time. Here, the hydrogen etching time was 60 minutes from the viewpoint of increasing the change in the thickness of the epitaxially grown layer and decreasing measurement errors.

Then, the thickness of the silicon carbide epitaxial wafer according to Example 1 after the hydrogen etching was measured using the FT-IR, and the difference in the thickness of the silicon carbide epitaxial wafer according to Example 1 before and after the hydrogen etching was calculated.

Then, the etching depth converted in terms of the etching time in Example 1 was calculated based on the total etching depth, the calculated difference in thickness. In other words, since the etching time in Example 1 was 1 minute, 1/60 of the total etching depth was calculated as the etching depth in Example 1.

In addition, also for the silicon carbide epitaxial wafer according to Comparative Example 1, the etching depth was similarly calculated.

As a result of these calculations, the etching depth of the silicon carbide epitaxial wafer in Example 1 was 1 nm. In addition, the etching depth of the silicon carbide epitaxial wafer in Comparative Example 1 was 4 nm.

Example 2 and Comparative Examples 2 and 3

Silicon carbide epitaxial wafers according to Example 2 and Comparative Examples 2 and 3 were manufactured as in Example 1 except that the hydrogen flow rate, the substrate heating temperature after silane introduction, and the pressure in the hydrogen etching step in Example 1 were changed as shown in the following Table 1.

In addition, the etching depth and the GSB density measured as in Example 1 are shown together in the following Table 1.

TABLE 1

| Examples/Comparative Examples | $H_2$ flow rate (slm) | Heating temperature (° C.) | Pressure (kPa) | Etching depth (nm) | Density of GSBs caused by BPDs (number/cm²) |
|---|---|---|---|---|---|
| Example 1 | 30 | 1,660 | 10 | 1 | 16 |
| Example 2 | 100 | 1,500 | 10 | 1 | 19 |
| Comparative Example 1 | 100 | 1,660 | 10 | 4 | About 200 |
| Comparative Example 2 | 100 | 1,710 | 10 | 10 | About 400 |
| Comparative Example 3 | 100 | 1,660 | 6 | 13 | About 550 |

As shown in this Table 2, when the hydrogen etching step is carried out under the conditions in which the etching depth is 1 nm or less, the density of GSBs caused by BPDs can be 20/cm² or less.

On the other hand, when the hydrogen etching step was carried out under the conditions in which the etching depth was more than 1 nm, the density of GSBs caused by BPDs was a numerical value greatly exceeding 20/cm².

Figure 8A:
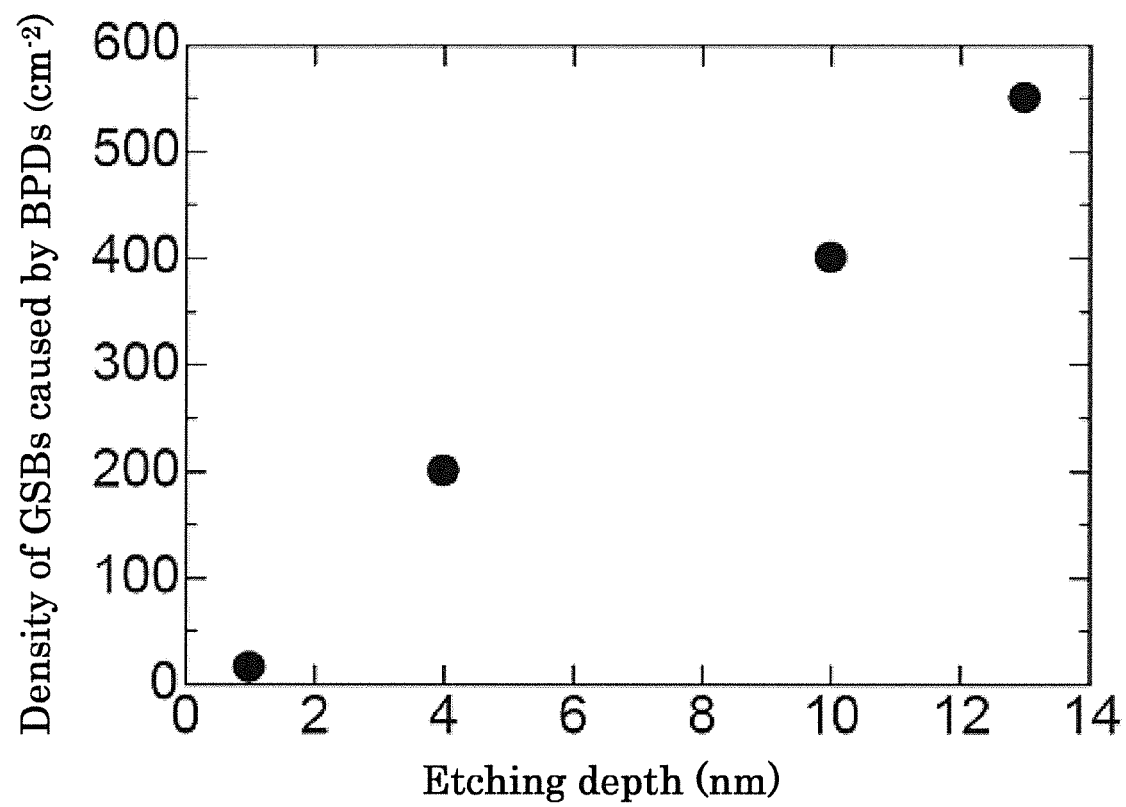
FIG. 8A is a diagram showing a graph obtained by plotting the density of GSBs caused by BPDs corresponding to etching depth in silicon carbide epitaxial wafers according to Examples 1 and 2 and Comparative Examples 1 to 3.
Figure 8B:
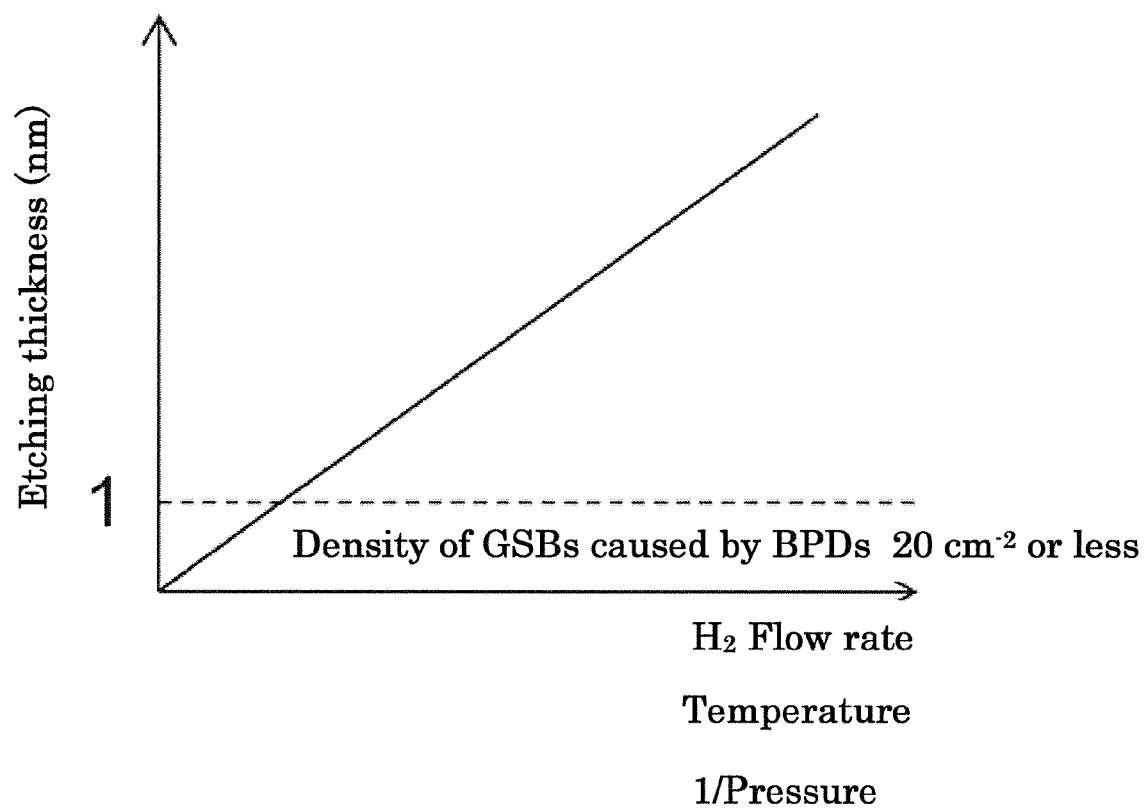
FIG. 8B is a diagram showing a graph showing the relationship between a hydrogen flow rate, substrate heating temperature, and pressure in a hydrogen etching step and etching depth.

Here, the relationship between the etching depth and the density of GSBs caused by BPDs will be described. FIG. 8A shows a graph obtained by plotting the density of GSBs caused by BPDs corresponding to the etching depth in the silicon carbide epitaxial wafers according to Examples 1 and 2 and Comparative Examples 1 to 3. In addition, FIG. 8B shows a graph showing the relationship between the hydrogen flow rate, the substrate heating temperature, and the pressure in the hydrogen etching step and the etching depth.

From these results, it is confirmed that in order to control the density of GSBs caused by BPDs at 20/cm² or less, it is necessary to set the etching depth at 1 nm or less. In addition, in order to control the etching depth at 1 nm or less, the conditions of the hydrogen flow rate, the substrate heating temperature, and the pressure in the hydrogen etching step should be appropriately adjusted.

Example 3

Figure 9:
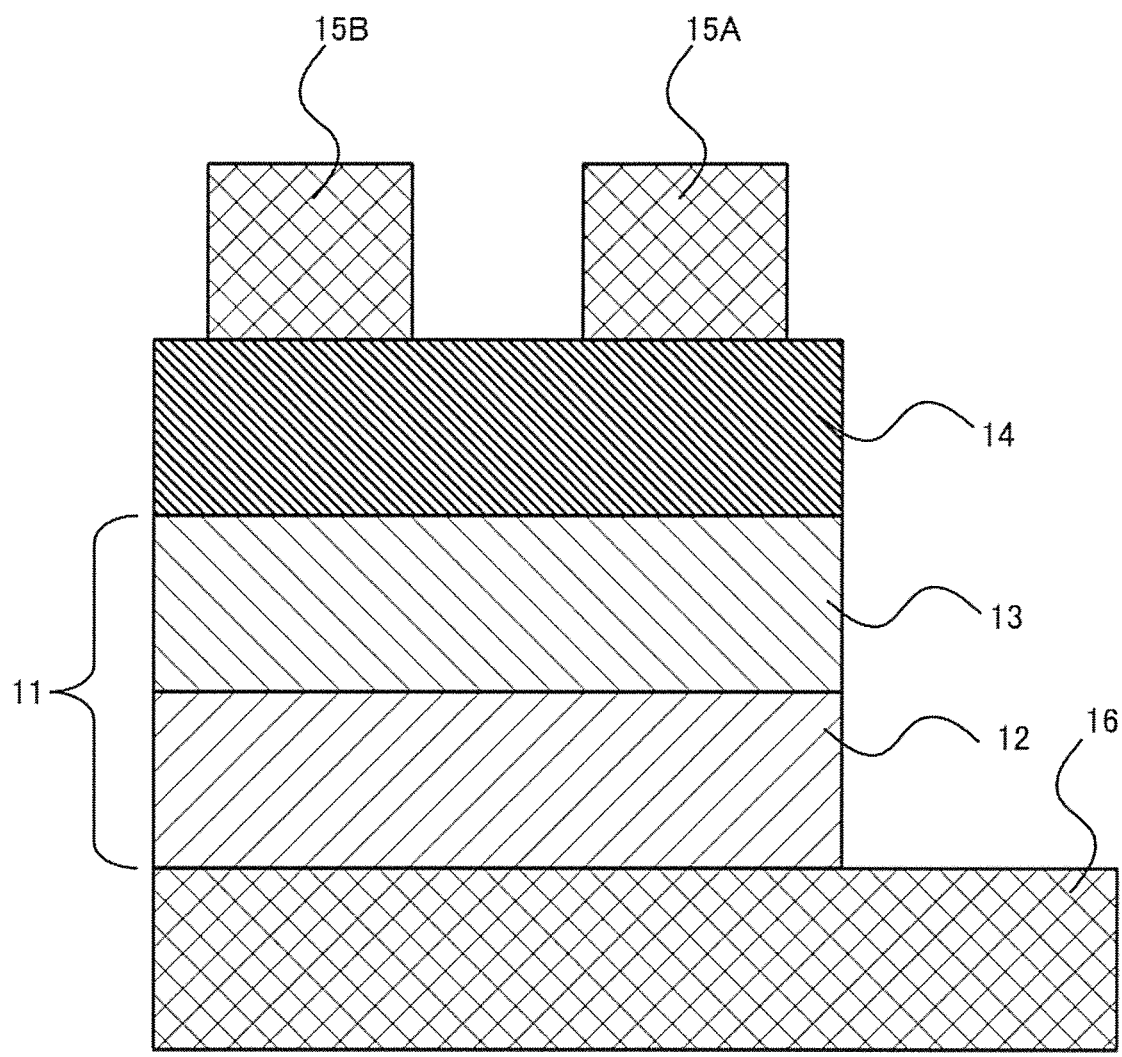
FIG. 9 is a cross-sectional view showing the schematic configuration of the device structure of a MOS capacitor.

A silicon carbide semiconductor device according to Example 3 having the device structure of a MOS capacitor shown in FIG. 9 was manufactured. FIG. 9 is a cross-sectional view showing the schematic configuration of the device structure of a MOS capacitor. Here, numeral 11 denotes a silicon carbide epitaxial wafer, numeral 12 denotes a silicon carbide substrate, numeral 13 denotes an epitaxially grown layer, numeral 14 denotes a silicon dioxide layer, numerals 15A and 15B denote upper electrodes, and numeral 16 denotes a lower electrode.

First, a silicon carbide epitaxial wafer in which the surface defect density of an epitaxially grown layer based on GSBs caused by BPDs was 16/cm² manufactured according to the manufacturing conditions in Example 1 was provided as the silicon carbide epitaxial wafer 11.

The surface of the epitaxially grown layer 13 of this silicon carbide epitaxial wafer 11 was oxidized in a 1,200° C.·$O_2$ atmosphere by thermal oxidation to form the silicon dioxide layer 14. The thickness of the silicon dioxide 14 at this time was 50 nm.

In addition, the upper electrodes 15A and 15B of Al were formed on the silicon dioxide layer 14 by a vapor deposition method.

In addition, the lower electrode 16 of Al was formed on the surface of the silicon carbide epitaxial wafer 11 on the silicon carbide substrate 12 side by a vapor deposition method.

Thus, the silicon carbide semiconductor device according to Example 3 having the device structure of a MOS capacitor was manufactured.

Comparative Example 4

A silicon carbide semiconductor device according to Comparative Example 4 was manufactured as in Example 3 except that instead of the silicon carbide epitaxial wafer in which the surface defect density of the epitaxially grown layer based on GSBs caused by BPDs was 20/cm$^2$, a silicon carbide epitaxial wafer in which the density was 200/cm$^2$ was used as the silicon carbide epitaxial wafer 11 in FIG. 9.

The measurement of the surface defect density of the epitaxially grown layer 13 based on GSBs on the silicon carbide substrate 12 from the silicon carbide epitaxial wafer 11 was performed by measuring the surface morphology of the surface of the epitaxially grown layer 13 by an AFM and confirming protruding surface defects having a height of 5 nm or more and a length of 1 mm or less because the GSBs have a protruding shape having a height of 5 nm or more and a length of 1 mm or less. In addition, the measurement of whether the GSBs were caused by BPDs or not was performed by confirming the crystal structure by an X-ray topograph.

<Evaluation of Dielectric Breakdown over Time>

The silicon carbide semiconductor devices according to Example 3 and Comparative Example 4 were subjected to the evaluation of dielectric breakdown over time by a constant current stress test.

In other words, the following evaluation was performed. An electric field was applied between the upper electrodes 15A and 15B and the lower electrode 16 shown in FIG. 9, and a stress current having a current density of 0.45 mA/cm$^2$ was kept flowing until the silicon dioxide layer 14 underwent dielectric breakdown. A silicon carbide semiconductor device in which dielectric breakdown occurred at a stage in which the sum of charge density derived from a leak current passing through the silicon dioxide layer 14 was 0.3 C/cm$^2$ or less was taken as a defective product, and a silicon carbide semiconductor device in which dielectric breakdown occurred at a stage in which the sum of charge density was more than 0.3 C/cm$^2$ was taken as a non-defective product.

In this evaluation of dielectric breakdown over time, 50 silicon carbide semiconductor devices according to Example 3 and 50 silicon carbide semiconductor devices according to Comparative Example 4 were manufactured and subjected to evaluation.

In the above evaluation of dielectric breakdown over time, in the silicon carbide semiconductor devices according to Comparative Example 4, the proportion of defective products was about 30%, whereas in the silicon carbide semiconductor devices according to Example 3, the proportion of defective products was only about 10%.

In addition, MOSFETs having a silicon dioxide layer fabricated by procedures similar to those of Example 3 and Comparative Example 4 were fabricated and similarly subjected to evaluation of dielectric breakdown over time. Similar results were obtained for the proportion of defective products.

From these results, by reducing the surface defect density of an epitaxially grown layer based on GSBs caused by BPDs, the reliability of a silicon carbide semiconductor device, particularly a silicon carbide semiconductor device having an oxide film on the epitaxially grown layer, can be improved.

REFERENCE SIGNS LIST 1 epitaxial wafer manufacturing apparatus
2 reaction furnace
3A etching gas introduction pipe
3B raw material gas introduction pipe
11 silicon carbide epitaxial wafer
12 silicon carbide substrate
13 epitaxially grown layer
14 silicon dioxide layer
15A, 15B upper electrode
16 lower electrode

What is claimed is:

1. A method for manufacturing a silicon carbide epitaxial wafer, comprising:
    introducing an etching gas comprising hydrogen gas onto a substrate surface of a silicon carbide substrate which has an α-type crystal structure and is tilted at greater than 0° and less than 5° relative to a (0001) Si face to perform hydrogen etching; and
    introducing a raw material gas to form an epitaxially grown layer on the substrate surface after the hydrogen etching, wherein
    the hydrogen etching is carried out under etching conditions for setting etching depth with respect to the substrate surface at 1 nm or less.

2. The method for manufacturing a silicon carbide epitaxial wafer according to claim 1, wherein the etching depth in the hydrogen etching is adjusted by controlling a hydrogen flow rate.

3. The method for manufacturing a silicon carbide epitaxial wafer according to claim 1, wherein the hydrogen etching and formation of the epitaxially grown layer are continuously carried out by one of starting introduction of the raw material gas in the formation of the epitaxially grown layer generally simultaneously with stop of introduction of the etching gas in the hydrogen etching, and additionally introducing as the raw material gas a gas necessary for the formation of the epitaxially grown layer lacking in the etching gas in a state in which introduction of the etching gas is continued.

4. The method for manufacturing a silicon carbide epitaxial wafer according to claim 1, wherein silane gas is contained in the etching gas and the raw material gas.

5. The method for manufacturing a silicon carbide epitaxial wafer according to claim 1, wherein a silicon carbide substrate is tilted in a <11-20> direction relative to a (0001) Si face at greater than 0° and less than 5° is used.

6. The method for manufacturing a silicon carbide epitaxial wafer according to claim 2, wherein the hydrogen etching and formation of the epitaxially grown layer are continuously carried out by one of starting introduction of the raw material gas in the formation of the epitaxially grown layer generally simultaneously with stop of introduction of the etching gas in the hydrogen etching, and additionally introducing as the raw material gas a gas necessary for the formation of the epitaxially grown layer lacking in the etching gas in a state in which introduction of the etching gas is continued.

7. The method for manufacturing a silicon carbide epitaxial wafer according to claim 2, wherein silane gas is contained in the etching gas and the raw material gas.

8. The method for manufacturing a silicon carbide epitaxial wafer according to claim 3, wherein silane gas is contained in the etching gas and the raw material gas.

9. The method for manufacturing a silicon carbide epitaxial wafer according to claim 6, wherein silane gas is contained in the etching gas and the raw material gas.

10. The method for manufacturing a silicon carbide epitaxial wafer according to claim 2, wherein a silicon carbide substrate is tilted in a <11-20> direction relative to a (0001) face at greater than 0° and less than 5° is used.

11. The method for manufacturing a silicon carbide epitaxial wafer according to claim 3, wherein a silicon carbide substrate is tilted in a <11-20> direction relative to a (0001) face at greater than 0° and less than 5° is used.

12. The method for manufacturing a silicon carbide epitaxial wafer according to claim 4, wherein a silicon carbide substrate is tilted in a <11-20> direction relative to a (0001) face at greater than 0° and less than 5° is used.

13. The method for manufacturing a silicon carbide epitaxial wafer according to claim 6, wherein a silicon carbide substrate is tilted in a <11-20> direction relative to a (0001) face at greater than 0° and less than 5° is used.

14. The method for manufacturing a silicon carbide epitaxial wafer according to claim 7, wherein a silicon carbide substrate is tilted in a <11-20> direction relative to a (0001) face at greater than 0° and less than 5° is used.

15. The method for manufacturing a silicon carbide epitaxial wafer according to claim 8, wherein a silicon carbide substrate is tilted in a <11-20> direction relative to a (0001) face at greater than 0° and less than 5° is used.

16. The method for manufacturing a silicon carbide epitaxial wafer according to claim 9, wherein a silicon carbide substrate is tilted in a <11-20> direction relative to a (0001) face at greater than 0° and less than 5° is used.

* * * * *